(12) United States Patent
Zhou et al.

(10) Patent No.: US 6,504,967 B1
(45) Date of Patent: Jan. 7, 2003

(54) PASSIVE ALIGNMENT METHOD AND APPARATUS FOR FABRICATING A MEMS DEVICE

(75) Inventors: Ping Zhou, Glendale, AZ (US); Robert Kehl Sink, Santa Barbara, CA (US)

(73) Assignee: Calient Networks, Inc., San Jose, CA (US)

( * ) Notice: Subject to any disclaimer, the term of this patent is extended or adjusted under 35 U.S.C. 154(b) by 21 days.

(21) Appl. No.: 09/586,527

(22) Filed: Jun. 2, 2000

(51) Int. Cl.[7] .................................................. G02B 6/26
(52) U.S. Cl. ........................................................ 385/18
(58) Field of Search ............................ 385/18, 147, 21, 385/22, 23

(56) References Cited

U.S. PATENT DOCUMENTS

| | | | | |
|---|---|---|---|---|
| 5,647,044 A | * | 7/1997 | Basavanhally et al. | 385/92 |
| 5,867,297 A | * | 2/1999 | Kiang et al. | 235/462.32 |
| 5,914,207 A | * | 6/1999 | Nishiki et al. | 385/147 |
| 6,097,860 A | * | 8/2000 | Laor | 385/16 |
| 6,178,284 B1 | * | 1/2001 | Bergmann et al. | 359/846 |
| 6,245,590 B1 | * | 6/2001 | Wine et al. | 438/14 |
| 6,295,154 B1 | * | 9/2001 | Laor et al. | 359/223 |

\* cited by examiner

*Primary Examiner*—Tulsidas Patel
(74) *Attorney, Agent, or Firm*—Blakely, Sokoloff, Taylor & Zafman LLP

(57) ABSTRACT

A micro-electro-mechanical-system (MEMS) mirror device passive alignment fabrication method is disclosed. In one embodiment, the method includes forming a release layer on a first substrate, forming a mirror pattern having a center mirror component and a hinge pattern supported by the release layer, forming a first passive alignment mechanism on the first substrate, forming an electrode layer on a second substrate, forming a second passive alignment mechanism on the second substrate, aligning the first and second substrates using the first and second passive alignment mechanisms, and attaching the first substrate with the second substrate by inserting a passive non-thermal bonding mechanism through the first and second passive alignment mechanisms.

4 Claims, 6 Drawing Sheets

PASSIVE ALIGNMENT METHOD AND APPARATUS FOR FABRICATING A MEMS DEVICE

FIELD OF INVENTION

This invention is related generally to fiber optics and optical switching systems. In particular, the invention is related to Micro-Electro-Mechanical system (MEMS) design and fabrication.

BACKGROUND OF THE INVENTION

A MEMS device is a micro-sized mechanical structure having mechanical circuitry fabricated using conventional integrated circuit (IC) fabrication methods. A well-known MEMS device is a microscopic gimbaled mirror mounted on a substrate. A gimbaled mirror is a device that may pivot on a hinge about an axis. By pivoting about an axis, a gimbaled mirror can redirect light beams to varying positions. Typically, MEMS gimbaled mirrors are arranged in an array on single silicon wafer substrate.

Fabrication of micro-mirror array chips used by a MEMS device requires precise alignment between the MEMS structure and other optical components such as optical fiber arrays or laser arrays. During the fabrication a MEMS device, it is often necessary to bond one part of the MEMS device found on one wafer to another part of the device that is formed on a different wafer. Conventionally, these multiple layers of a MEMS device are aligned using a "flip-chip" optical alignment system to align the two wafers, or two parts, to each other. Fixtures are used to hold the wafers together, then the wafers are attached to each other.

This alignment process for joining the two wafers is therefore an active alignment process. The active alignment process requires a laser beam generating system and a laser beam detection system to check the optical alignment of the wafers. The MEMS components are aligned in position when the optimal optical coupling between the laser beam generating system and the detection system is achieved.

This prior solution relies on expensive machines and is time consuming. It is difficult to achieve high precision alignment between two wafers, or components, of the MEMS device because the fixtures used to hold the wafers in place may cause alignment shift. It is also difficult to align the MEMS system with another optical system such as a fiber array or lens array using this active alignment process. Furthermore, conventional bonding processes often rely on heat to bond the two wafers together. However, if one wafer has a thermal expansion coefficient that is different than the thermal expansion coefficient of the other wafer, then the heat bonding process will cause one wafer to expand more than the other wafer. As a result, one or both of the wafers will be distorted.

SUMMARY OF THE INVENTION

A micro-electro-mechanical-system (MEMS) mirror device passive alignment fabrication method is disclosed. In one embodiment, the method includes forming a release layer on a first substrate, forming a mirror pattern having a center mirror component and a hinge pattern supported by the release layer, forming a first passive alignment mechanism on the first substrate, forming an electrode layer on a second substrate, forming a second passive alignment mechanism on the second substrate, aligning the first and second substrates using the first and second passive alignment mechanisms, and attaching the first substrate with the second substrate by inserting a passive non-thermal bonding mechanism through the first and second passive alignment mechanisms.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A micro-electro-mechanical-system (MEMS) mirror device passive alignment fabrication method is disclosed. In one embodiment, the method includes forming a release layer on a first substrate, forming a mirror pattern having a center mirror component and a hinge pattern supported by the release layer, forming a first passive alignment mechanism on the first substrate, forming an electrode layer on a second substrate, forming a second passive alignment mechanism on the second substrate, aligning the first and second substrates using the first and second passive alignment mechanisms, and attaching the first substrate with the second substrate by inserting a passive non-thermal bonding mechanism through the first and second passive alignment mechanisms.

An advantage of the passive alignment method and apparatus is providing precise alignment between the MEMS structure and other optical components such as optical fiber arrays or laser arrays during fabrication of the MEMS device. The passive alignment method and apparatus enables precision alignment without the active alignment mechanism of the prior art.

Another advantage of the passive alignment method and apparatus is enabling one wafer of a MEMS device to be bonded to another wafer of the device during fabrication of the MEMS device. The passive alignment method and apparatus enables this bonding to occur without using the thermal bonding process of the prior art. Thus, if the wafer bonding process cannot survive a thermal bonding process due to a large thermal expansion coefficient mismatch of the two wafer materials, the passive alignment process can be used to bond the two wafers, because the passive alignment process does not require heat to bond the wafers together. For example, a passive non-thermal alignment mechanism, such as a pin, for example, can be placed through the passive alignment mechanisms, for example, through-holes, of both wafers to hold the wafers together.

Furthermore, assembling the wafers of a MEMS device using the passive, non-thermal bonding mechanism, such as an alignment pin or ball, by inserting the bonding mechanism through the passive alignment mechanisms, reduces the packaging process cost significantly in comparison with active alignment.

Figure 1:
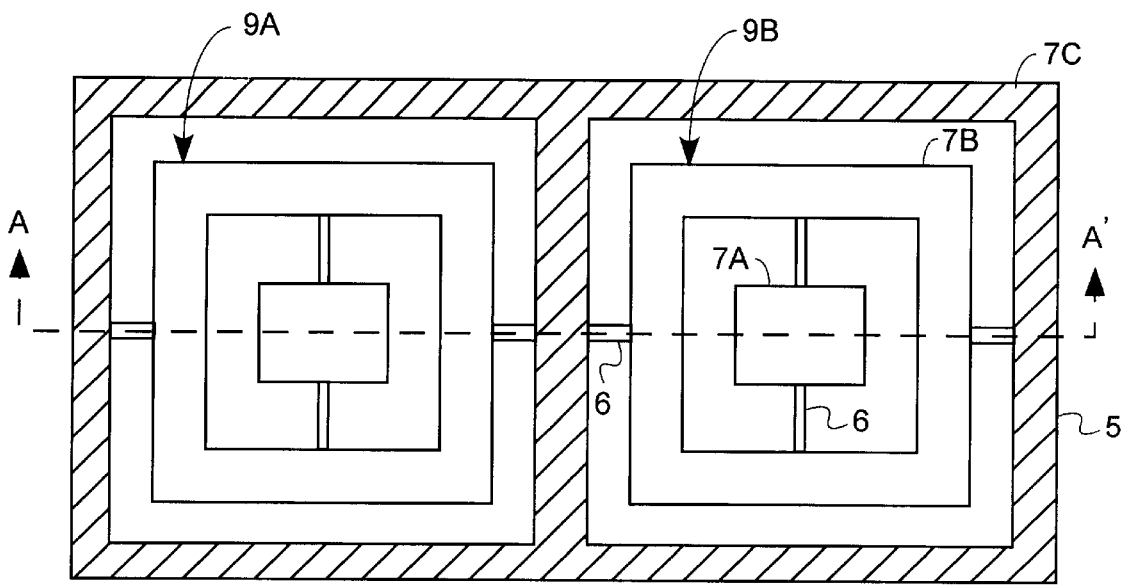
FIG. 1 is a top view of a MEMS mirror device according to one embodiment.

FIG. 1 is top view of one embodiment of a MEMS mirror device without electrodes and a wiring pattern illustrating a first mirror device 9A and a second mirror device 9B having a support structure 5, hinge pattern 6, and mirror pattern 7. Mirror pattern 7 may include a center mirror component 7a, frame pattern 7b, and mirror component 7c. Center mirror component 7a is capable of having an angular range of motion with respect to an axis. Frame pattern 7b provides support for center mirror component 7a. Mirror component 7c may be used for passive alignment or passive, non-thermal bonding purposes.

Figure 2:
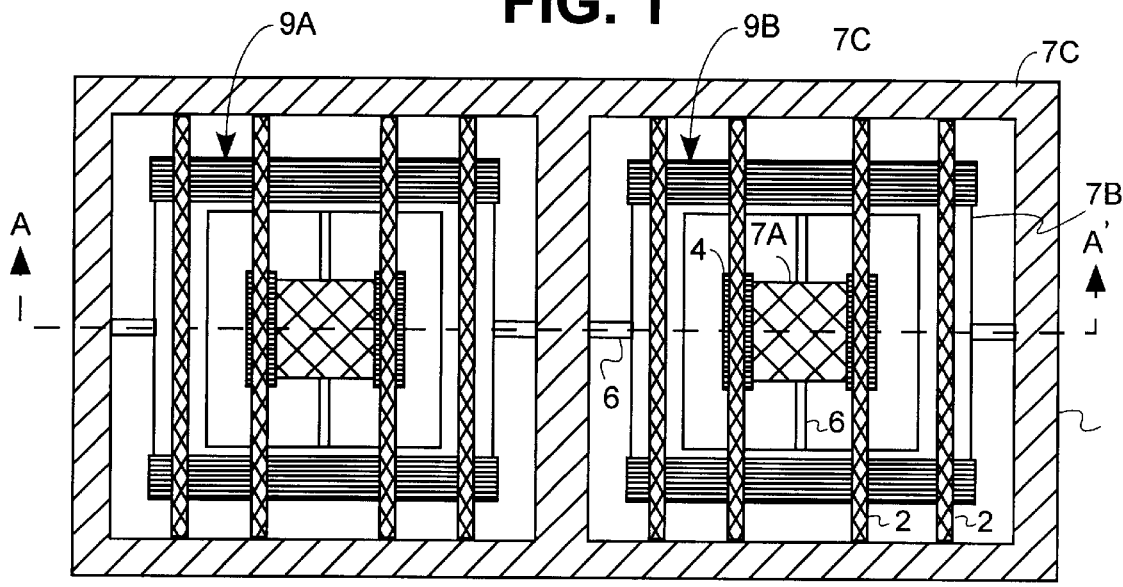
FIG. 2 is a top view of a MEMS mirror device according to one embodiment illustrating electrodes and a wiring pattern.

FIG. 2 is a complete top view of one embodiment of a MEMS mirror device such as that shown in FIG. 1 further illustrating electrodes 4 and wiring pattern 2 for the first mirror device 9A and second mirror device 9B.

Figure 3:
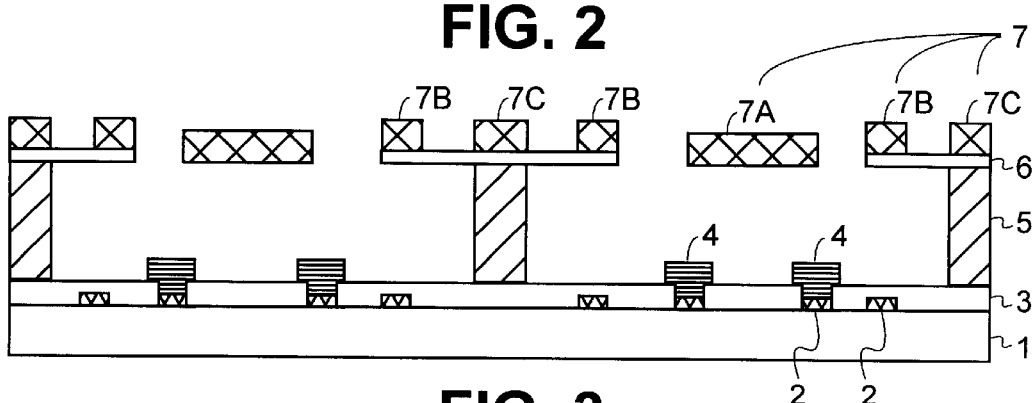
FIG. 3 is a cross-sectional side view of one embodiment along the line A–A' such as that shown in FIG. 2.

FIG. 3 is a cross sectional side view showing the structure of one embodiment of a MEMS mirror device taken along the line A–A' such as that shown in FIG. 2. As shown in FIG. 3, a MEMS mirror device includes a substrate 1 having wiring pattern 2 formed thereon. Electrodes 4 are formed such that electrodes are coupled with wiring pattern 2. An insulation layer 3 is formed to provide insulation for wiring pattern 2 and electrodes 4.

Support structure 5 is formed on insulation layer 3 adjacent from electrodes 4. Support structure 5 may include a post structure to provide support for layers formed thereon or attached therewith. Support structure 5 may define a honeycombed shape. Support structure 5 may also define holes such that the holes are centered approximately below the center mirror component. Support structure 5 provides support for hinge pattern 6 and mirror pattern 7.

Mirror pattern 7 includes a center mirror component 7a, frame pattern 7b, and mirror component 7c. Hinge pattern 6 is attached with mirror pattern 7 and support structure 5. Hinge pattern 6 may be a thin and flexible material. Hinge pattern 6 provides support for mirror pattern 7. Frame pattern 7b provides support for center mirror component 7a. Mirror component 7c is supported by hinge pattern 6 and may be used for passive alignment or passive, non-thermal bonding purposes.

The center mirror component 7a is formed such that it is disposed above electrodes 4. Center mirror component 7a includes a reflective surface to reflect beams of light. Electrodes 4 are located below at opposing edges of center mirror component 7a. Center mirror component 7a may also be connected with a ground line (not shown) in substrate 1 for electrical shielding purposes. Electrodes 4 are coupled with a respective wiring pattern 2 located on substrate 1. Alternatively, a ground line may be disposed between electrodes 4 and wiring pattern 2 for purposes of electrical shielding.

Center mirror component 7a may move about an axis to have an angular range of motion caused by electrostatic actuation from electrodes 4. Electrostatic actuation is caused by a voltage being applied to electrodes 4 through wiring pattern 2. A voltage applied to electrodes 4 creates an electric field between, for example, electrodes 4 and center mirror component 7a. Typically, the electric field is created near the edges of center mirror component 7a. The electric field causes center mirror component 7a to have an angular range of motion with respect to an axis such as, for example, an axis parallel to hinge pattern 7. The edges of center mirror component 7a towards electrodes 4 at which the voltage is applied moves towards such electrodes 4.

By increasing the angular range of motion for center mirror component 7a, center mirror component 7a can redirect beams of light to a larger number of positions thereby increasing flexibility for optical switching. Increasing the thickness for support structure 5 can increases the angular range of motion for center mirror component 7a. Support structure 5 having an increased thickness provides a larger height for center mirror component 7a to be off of substrate 1. Because center mirror component 7a may have a large height off substrate 1, center mirror component 7a is provided with a larger angular range of motion.

For the following embodiments, the support structure can be fabricated to support the hinge pattern and mirror pattern such that a bottom surface of the center mirror component in a stationary non-rotating position is capable of exceeding a height of 50 $\mu$m above the electrodes. Also, in the following embodiments, the support structure may support the hinge pattern and mirror pattern such that the bottom surface of the center mirror component in a stationary non-rotating position is capable of having a height about 100 $\mu$m above the electrodes. At such heights, the following embodiments provide a center mirror component that is capable of having an angular range of motion exceeding 20 degrees with respect to an axis.

FIGS. 4a through 4f are cross-sectional side views illustrating a method for fabricating the MEMS mirror device using a passive alignment mechanism of a first substrate and a second substrate.

Figure 4A:
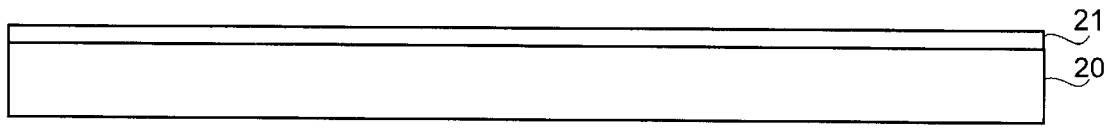
FIGS. 4a through 4f are cross-sectional side views illustrating one embodiment of a method for fabricating the MEMS mirror device using a passive alignment process.

Referring to FIG. 4a, a polymer layer is formed on a first substrate 20 to form a release layer 21. Release layer 21 may also be a layer that can be etched easily away or is removed easily from first substrate 20. For example, release layer 21 may be a polysilicon layer, oxide layer, or a nitride layer. First substrate 20 may be a silicon substrate, glass substrate, or a borosilicate glass substrate.

Figure 4B:
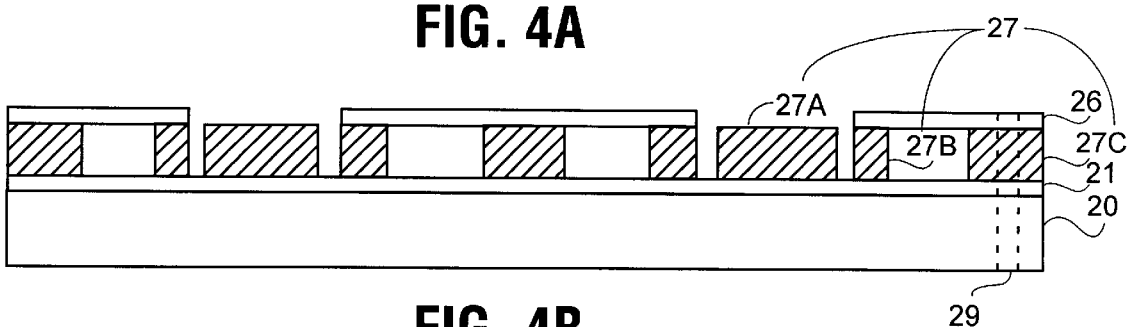

Referring to FIG. 4b, at least one layer having light reflective properties is formed on release layer 21. For example, a metal layer having light reflective properties may be formed on release layer and selectively pattern and etched to form mirror pattern 27. The metal layer may be a gold Au metal layer, aluminum Al metal layer, or a copper Cu metal layer. Mirror pattern 27 includes a center mirror component 27a, frame pattern 27b, and mirror component 27c formed on release layer 21.

Multiple layers may also be used to form mirror pattern 27. For example, a first metal layer is formed on release layer 21. A support layer is formed on the first metal layer. A second metal layer is formed on the support layer. The three layers are selectively patterned and etched to form mirror pattern 27.

The first and second metal layers are layers having light reflective properties. For example, a gold Au metal layer, an aluminum Al metal layer, or a copper Cu metal layer may be used for the first and second metal layers. The support layer is a layer that provides a flat surface and structural support. For example, a silicon dioxide $SiO_2$ layer, silicon nitride $Si_xN_y$ layer, polysilicon layer, silicon oxynitride $Si_xO_yN_z$ layer, or a polymer layer may be used for the support layer. Alternatively, the support layer may include the same material as the first and second metal layers.

After mirror pattern 27 is formed on release layer 21, a polysilicon layer is formed over mirror pattern 27 and is selectively patterned and etched to form hinge pattern 26. Alternatively, a polymer layer, oxide layer, nitride layer, silicon nitride $Si_xN_y$ layer, silicon dioxide $SiO_2$ layer, or silicon oxynitride $Si_xO_yN_z$ layer may be used that is selectively patterned and etched to form hinge pattern 26. Hinge pattern 26 is formed on portions of mirror pattern 27. Hinge pattern 26, however, is not formed on center mirror component 27a. Hinge pattern 26 is formed to be thin and flexible.

A first passive alignment mechanism 29 may be formed on substrate 20. For example, a through hole 29 may have etched through hinge pattern 26, mirror pattern 27, release layer 21, and substrate 20. Alternatively, first passive alignment mechanism 29 may be located at another position of substrate 20, by etching a through hole. Additional passive alignment mechanisms may also be formed on substrate 20.

Figure 4C:
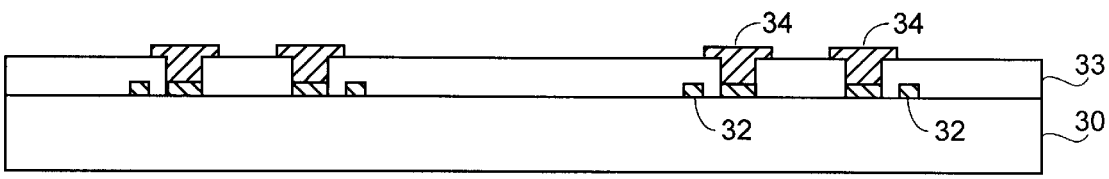

Referring to FIG. 4c, a first metal layer is formed on a second substrate 30 and is selectively patterned and etched to form wiring pattern 32. Second substrate 30 may be may be a silicon substrate, glass substrate, or borosilicate glass substrate. The first metal layer may be a metallic layer such as, for example, an aluminum Al layer. After forming wiring pattern 32, an oxide layer is then formed over wiring pattern 32 and second substrate 30 and is selectively patterned and etched to form insulation layer 33. Insulation 33 is formed such that portions of wiring pattern 32 are exposed. Alternatively, other dielectric layers may be used such as, for example, silicon dioxide $SiO_2$ layer, silicon nitride $Si_xN_y$ layer, or silicon oxynitride $Si_xO_yN_z$ layer, that can be selectively patterned and etched to form insulation layer 33.

After forming insulation layer 33, a second metal layer is formed over insulation layer 33 and wiring pattern 32 and is selectively patterned and etched to form electrodes 34. The second metal layer may also be a metallic layer such as, for example, an Al layer. Electrodes 34 are formed such that they are coupled with wiring pattern 32. Insulation 33 provides insulation for wiring pattern 32 and electrodes 34.

Figure 4D:
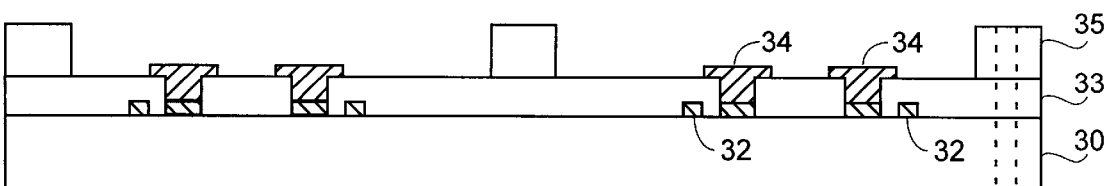

Referring to FIG. 4d, a thick patterned film is used to form support structure 35. A metal plating process is used with the thick patterned film to form support structure 35. For example, an electroless metal deposition process may be used to form support structure 25.

Initially, for the electroless metal deposition process, a thick photo resist film is formed on insulation layer 33 and selectively patterned to allow support structure 35 to be formed therein on insulation layer 33. Alternatively, a thick photo resist film may be formed on hinge pattern 26 and selectively patterned to allow support structure 35 to be formed on hinge pattern 26.

Subsequently, an aqueous solution having nickel Ni is deposited over the patterned photo resist film such that nickel Ni is formed in the patterned thick photo resist film. After Ni is formed, the remaining photo resist film is removed to form support structure 35 made of Ni. Alternatively, an aqueous solution having copper Cu or gold Au may be used to form support structure 35 using the electroless metal deposition process. The remaining photo resist film is then removed.

Alternatively, an electroplating process or a metal sputtering process may be used. For the electroplating process, a thick photo resist film is formed on insulation layer 33 and selectively patterned to allow support structure 35 to be formed therein on insulation layer 33. Alternatively, a thick photo resist film is formed on hinge pattern 26 and selectively patterned to allow support structure 35 to be formed therein on hinge pattern 26.

Subsequently, an electroplating solution having nickel Ni is deposited over the patterned photo resist film and an electric current is passed through the solution such that Ni is formed in the patterned thick photo resist film. After Ni is formed, the remaining photo resist film is removed to form support structure 35 made of Ni. Alternatively, an electroplating solution having copper Cu or gold Au may be used to form support structure 35 using the electro-plating process. Depending on where the patterned photo resist film is formed, a thin conductive layer (not shown) may be formed selectively on insulation layer 33 or hinge pattern 26 to assist in the electro-plating process. The photo resist film is then removed.

For the sputtering process, a thick photo resist film is formed on insulation layer 33 and selectively patterned to allow support structure 35 to be formed therein on insulation layer 33. Alternatively, a thick photo resist film is formed on hinge pattern 26 and selectively patterned to allow support structure 35 to be formed therein on hinge pattern 26.

Subsequently, metal is sputtered on the patterned thick photo resist film such that the metal is formed therein. For example, nickel Ni, copper Cu, or gold Au may be sputtered on the patterned thick photo resist film such that metal is formed therein. Subsequently, the remaining patterned thick photo resist film and metal formed thereon are removed to form support structure 35. The thick photo resist film is then removed.

A second passive alignment mechanism may be formed on substrate 30. For example, a through hole 39 may be etched through support structure 35, insulation layer 33, and substrate 30. The location of second passive alignment mechanism 39 on substrate 30 is related to the location of the first passive alignment mechanism 29 on substrate 20, such that when first substrate 20 is properly aligned with second substrate 30, the first and second alignment mechanisms will form one continuous through hole through both substrates. If first substrate 20 has additional passive alignment mechanisms, second substrate 30 may also have corresponding additional passive alignment mechanisms.

Figure 4E:
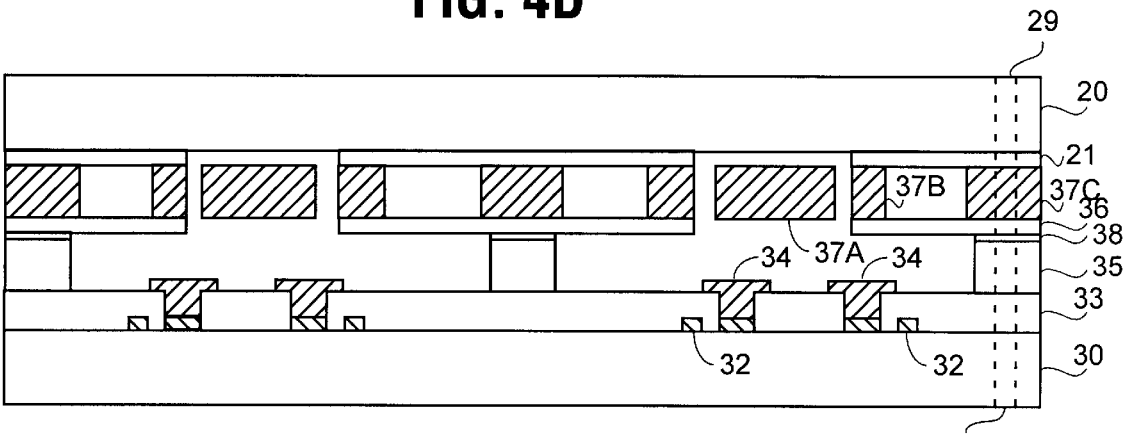

Referring to FIG. 4e, first substrate 20 is passively aligned with second substrate 30 using passive alignment mechanisms 29 and 39. First substrate 20 may be attached with second substrate 30 by inserting a passive, non-thermal bonding mechanisms, such as a pin, for example, through the first and second passive alignment mechanisms 29 and 39.

Support structure 35 can be further bonded to insulation layer 33 or hinge pattern 26 using a soldering bond technique that forms a bonding layer. For example, if support structure 35 is formed on insulation layer 33, a bonding layer 38 may be formed to bond support structure 35 with hinge pattern 26. The bonding layer may include a lead-tin PbSn mixture. Alternatively, a thin metal layer may be formed on hinge pattern 26 or insulation layer 33 to assist in the bonding process.

Figure 4F:
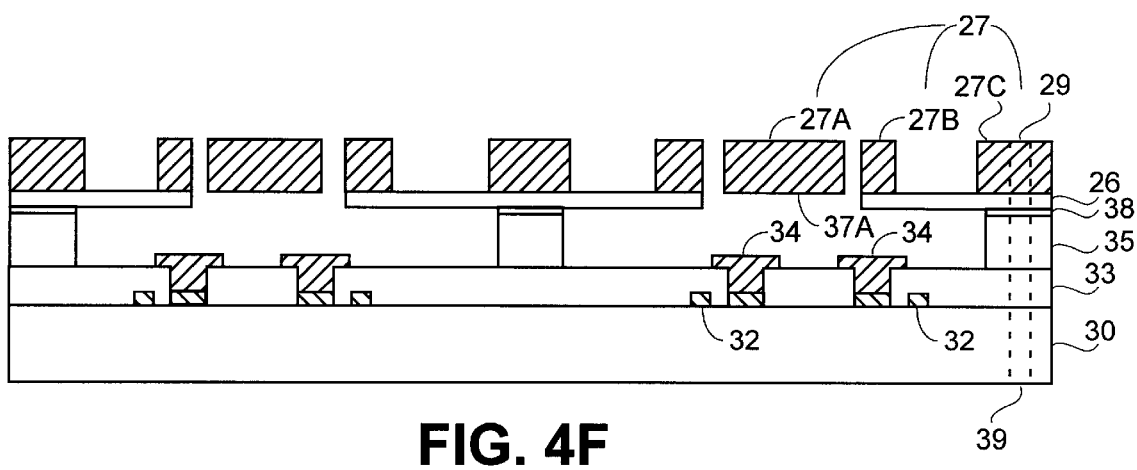

Referring to FIG. 4f, after first substrate 20 is attached with second substrate 30, first substrate 20 and release layer 21 are removed such that support structure 35 supports hinge pattern 26. Hinge pattern 26 supports mirror pattern 27. First substrate 20 may be removed using an etching or polishing process. For example, first substrate 20 may be etched away using hydro-fluoric (HF) acid or first substrate 20 may be polished away. Release layer 21 may be removed using oxygen plasma, wet etch, or a dry etch process.

Although one embodiment of fabricating a passive alignment mechanism on a mirror device has been described, several fabrication methods may be used to fabricate the passive alignment mechanisms. For example, with respect to formation of a hole passive alignment mechanism, example methods for fabricating the holes are by wet chemical etching and by dry etching. An advantage of forming a hole passive alignment mechanism by dry etching is creating holes that have vertical sidewalls. A Bosch process for deep reactive ion etching (DRIE) may be used. The masking material used to create the mask for the etching may include silicon dioxide ($SiO_2$), photoresist, or metal. Any of these materials can be patterned by standard processing methods familiar to the semiconductor industry.

For passive alignment of two substrates, the passive alignment holes that are etched are directed perpendicular to the substrate surface. For alignment of a MEMS mirror array to a fiber and lens array, or for alignment of two MEMS mirror arrays to each other, the alignment holes in one (or both) of the substrates may be angled relative to the substrate surface. One method for fabricating these holes is by using DRIE and putting the wafer in the etching chamber at an angle so that holes are etched at an angle. When using this process the temperature of the substrate should be controlled, as the etch parameters depend on temperature.

The hole passive alignment mechanisms may be used to align two substrates or components by inserting a pin through the holes. For example, the passive alignment fabrication methods described above form holes in both substrates and imply the use of an external pin inserted into the holes to align both substrates. These methods can also be used where an alignment hole or holes are fabricated on only one of the two substrates. On the other subtrate, a pin can be fabricated. Several methods for fabricating the passive alignment pins may be used. For example, the pins may be fabricated by patterning thick photoresist, Nickel (Ni) plating, or etching pins with wet or dry etching.

The thick photoresist fabrication method involves depositing (e.g., spin deposited) one or more layers of photosensitive material. This material is selectively exposed and then developed to form the pin pattern. A photosensitive material is selected that is thick enough to form the pins.

Alternatively, other fabrication methods may be used. For example, thick photoresist is used to define the pattern of the pin. Ni is then plated inside the photoresist pattern. This can be done using a number of standard electrolitic or electroless plating processes for Ni, Copper (Cu), or other metals and alloys. Alternatively, solder plating or solder paste could be used to form the pins inside the photoresist mask.

Another method for fabricating these pins includes defining a pattern using photosensitive material and then etching the pin structure into the substrate or epitaxial layers. This etching can be done using a wet or dry chemistry as described for the formation of the holes above. If wet chemistry is used, the pins can easily be made to be tapered by using the anisotropy of the wet etch chemistry. For example, certain crystal orientations of silicon etch faster than others in HCl, which may be used to define pyramid shaped pillars. These tapered structures would make insertion of the pin into the hole easier. Dry etching as described above (DRIE) may also be used, and would provide more vertical sidewalls than the other methods.

Figure 5A:
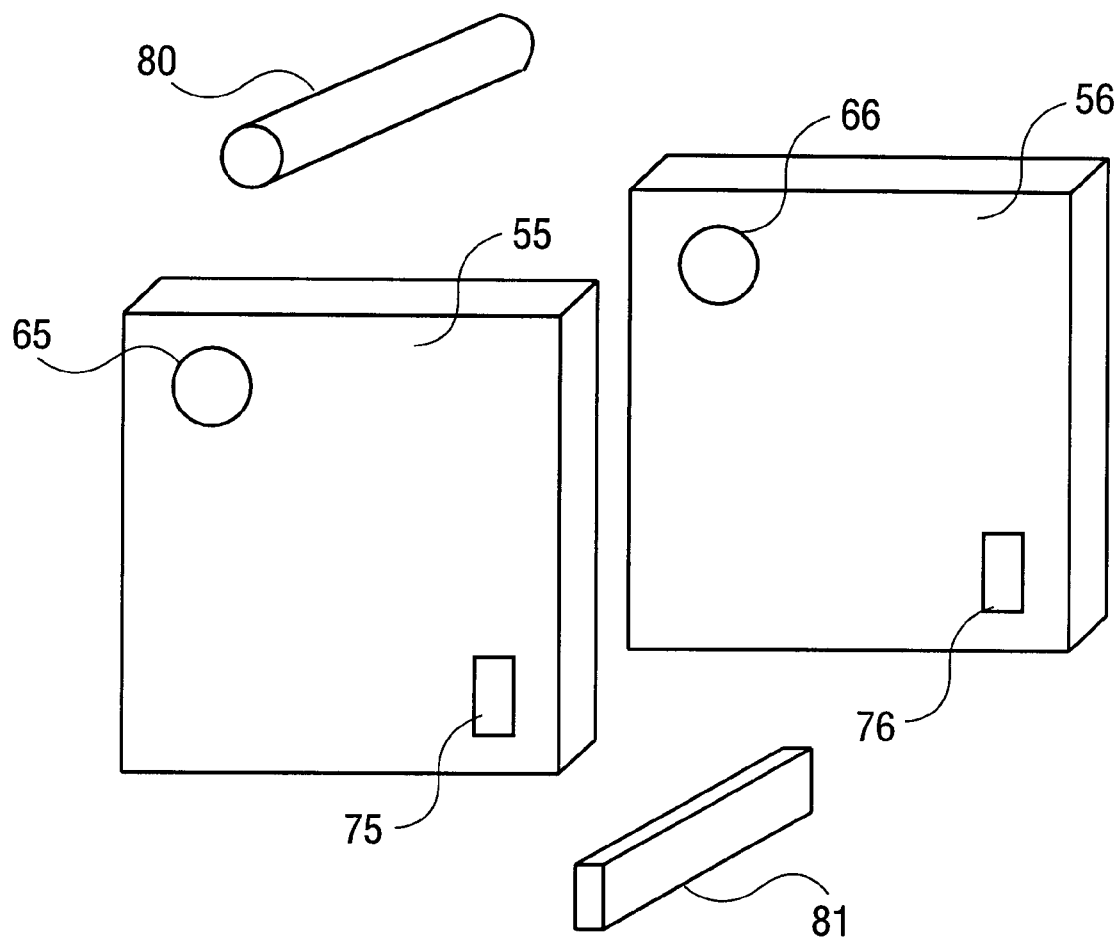
FIGS. 5A and 5B are top views illustrating one embodiment of a method for fabricating a MEMS mirror device using a passive alignment process.

FIG. 5a shows a top view of passive alignment mechanisms, such as through holes, for example, etched through micro-mirror wafer 55 and the electrode substrate 56. The micro-mirror wafer 55 can be flip-chip bonded onto the electrode substrate 56 by aligning the wafer 55 with the substrate 56 using passive alignment mechanisms 65, 66, 75, and 76. For example, passive alignment mechanism 65 is aligned with passive alignment mechanism 66, such that passive alignment mechanisms 65 and 66 form one continuous through hole through wafer 55 and substrate 56. Similarly, passive alignment mechanism 75 is aligned with passive alignment mechanisms 76, such that mechanisms 75 and 76 form one continuous through hole through wafer 55 and substrate 56. The passive alignment mechanisms may be aligned by inserting an alignment pin through the passive alignment mechanisms. For example, alignment pin 80 may be inserted through passive alignment mechanisms 65 and 66. Alignment pin 81 may be inserted through passive alignment mechanisms 75 and 76. The alignment pins may also be used to attach wafer 55 to substrate 56. Thus, the alignment pins 80 and 81 are also passive non-thermal bonding mechanisms.

Figure 5B:
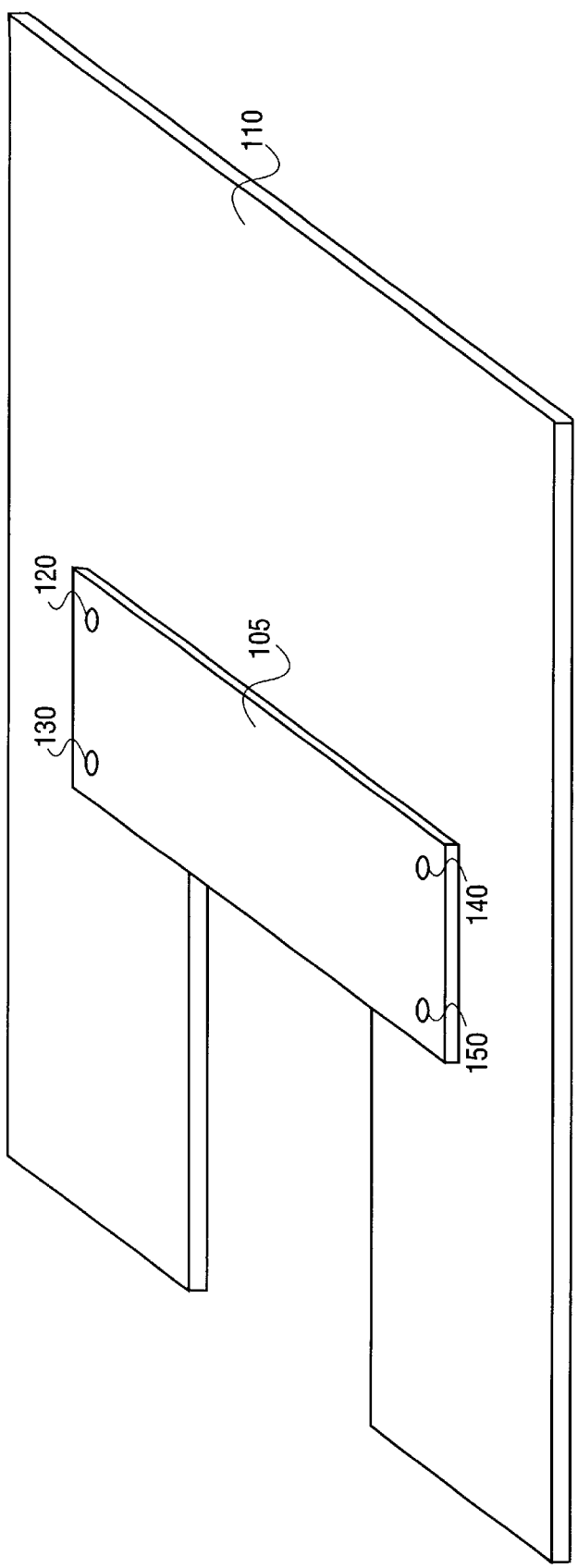

The passive alignment mechanisms can also serve as alignment mechanisms for the next level packaging, as shown in FIG. 5B. The micro-mirror chip 105 is passively aligned and bonded to ceramic carrier 110 using passive alignment mechanisms 120, 130, 140, and 150 which are etched through the chip 105 and carrier 110. Alignment pins can be used to align and passively bond the chip 105 to carrier 110. The passive alignment mechanism can also passively align the micro-mirror array to other optical components such as fiber arrays, laser arrays or detector arrays.

In one embodiment of the passive alignment method and apparatus, passive alignment mechanisms such as precision through holes are etched on the different wafers as well as on the MEMS chips to enable passive alignment of different wafers or chips. An advantage of passive alignment is enabling precision alignment for either bonding or assembly of one component with other system components without using the expensive machinery needed for active alignment or the thermal heating required for thermal bonding.

Adding a passive alignment mechanism, such as through hole, on each substrate is a silicon compatible process. The MEMS device can have a through hole created by a deep hole etch, for example, so that no additional process steps are needed. After the through holes for alignment are etched, two or more wafers can be aligned and bonded without the need for expensive alignment machines and fixtures. For example, two or more wafers can be aligned and bonded simultaneously by using a passive non-thermal bonding mechanism, such as a pin, that can be inserted into the passive alignment mechanisms to bond the wafers together.

Figure 6:
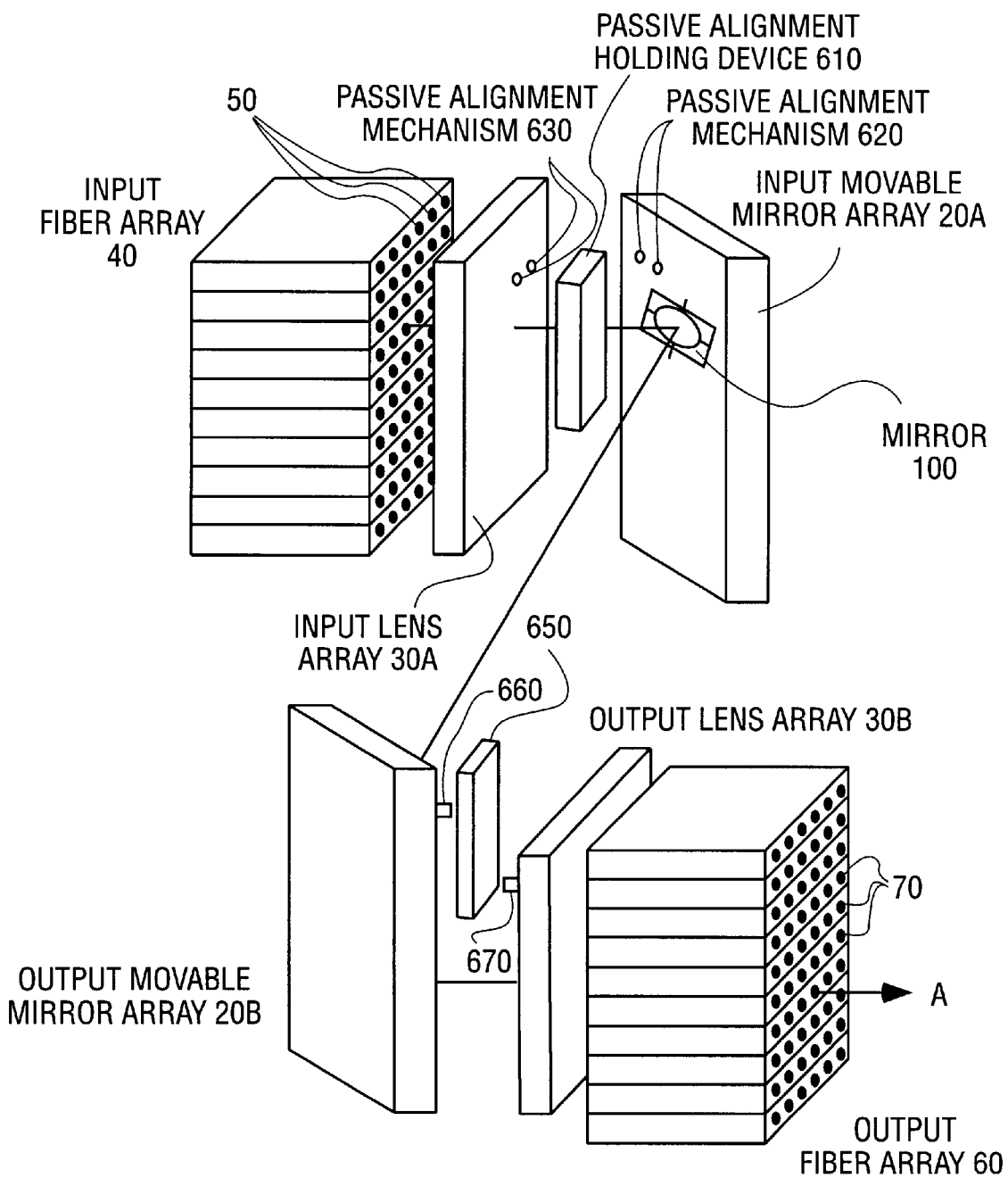
FIG. 6 is an embodiment of a passive alignment mechanism to align components of an optical switch.

Referring to FIG. 6, a passive alignment mechanism is used to align components of an optical switching system 10. For example, optical switching system 10 may represent a 3-dimensional optical switching system. A 3-dimensional optical switching system allows for optical coupling between input fibers and output fibers in different planes using lens arrays and mirror arrays. The lens arrays and mirror arrays provide proper angle and position of light beams traveling from input fibers to output fibers. That is, a light beam must leave and enter a fiber in a direct path. Thus, using the optical switch shown in FIG. 6, any optical input can be connected to any optical output through the mirror arrays 20A and 20B, which contain mirrors that can be rotated along two axes.

Referring to FIG. 6, optical switching system 10 includes input fiber array 40, input lens array 30A, input MEMS movable mirror array 20A, first passive alignment mechanism 630, second passive alignment mechanism 620, passive alignment mechanism holder device 610, output MEMS movable mirror array 20B, output lens array 30B, and output fiber array 60.

Input fiber array 40 provides a plurality of optical fibers 50 for transmitting light to input lens array 30A. Input lens array 30A includes a plurality of optical lenses, which are used to collimate and focus beams of light from input fiber array 40 to individual MEMS mirror devices on MEMS input movable mirror array 20A. MEMS input movable mirror array 20A includes a plurality of electrically addressable MEMS mirror devices 100.

MEMS mirror device 100 may be a gimbaled mirror device having a rectangular shape. Alternatively, MEMS mirror device 100 may be a gimbaled mirror device having an elliptical or circular shape. The plurality of MEMS mirror devices 100 for MEMS input movable mirror array 20A can pivot a mirror component to redirect or reflect light to varying MEMS mirror devices on second MEMS mirror array 20B. MEMS output movable mirror array 20B also includes a plurality of MEMS mirror devices such as MEMS mirror device 100, which are used to redirect and reflect light beams to varying lenses on output lens array 30B. Output lens array 30B collimates and focuses beams of light from output mirror array 20B to individual output fibers 70 of output fiber array 60.

Optical switching system 100 allows light beams from any input fiber 50 of input fiber array 40 to be redirected to any output fiber 70 of output fiber array 60. For example, a light beam following the path "A" is outputted from one input fiber and is redirected using MEMS movable mirror arrays 20A and 20B to a different output fiber. The MEMS movable mirror arrays may also be used in scanning systems, printing systems, display systems, and other systems that require redirecting beams of light.

Passive alignment holder device 610 includes passive alignment mechanisms for connecting input fiber array 40 and lens array 30A to input movable mirror array 20A. In one embodiment, passive alignment holder device 610 includes passive alignment mechanism 620 to attach the input fiber array 40 and lens array 30A to the holder device 610. Input fiber array 40 and lens array 30A also include a passive alignment mechanism 630 to attach these components to holder device 610. The passive alignment mechanism 620 may be one or more pins, and passive alignment mechanism 630 may be one or more corresponding holes to receive the pins, so that when pins 620 are inserted into holes 630, the holder device 610 is aligned and attached to the fiber array 40 and lens array 30A. Alternatively, alignment mechanism 630 may be one or more pins, and alignment mechanism 620 may be one or more corresponding holes. In another embodiment, alignment mechanisms 620 and 630 may both be holes, and a third alignment mechanism, such as a pin, for example, can be inserted through mechanisms 620 and 630 to align and attach the fiber and lens arrays to the holder device.

In an alternative embodiment, the passive alignment mechanisms 620 and 630, and passive alignment mechanism holder device 610 may be used to passively align and attach input movable mirror array 20A to output movable mirror array 20B. In another embodiment, the passive alignment mechanisms 620 and 630, and passive alignment mechanism holder device 610 may be used to passively align and attach output movable mirror array 20B to output lens array 30B and output fiber array 60.

For example, a second passive alignment mechanism holding device 650 includes passive alignment devices such as holes, for example. Passive alignment mechanism 660, located on mirror array 20B, which may be a pin, for example, is inserted into the passive alignment devices of holding device 650. Passive alignment mechanism 670, located on lens array 30B is similarly inserted into holding device 650, thus passively aligning and connecting the mirror array 20B to lens array 30B. Other embodiments, such as using holes for passive alignment mechanisms 660 and 670, and pins for passive alignment devices on holding device 650, may also be used.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A micro-electro-mechanical-system (MEMS) switching device having passive alignment mechanisms, comprising:

a plurality of optical fiber input ports to receive one or more input light beams into the switching device, said input ports having a first passive alignment mechanism;

a plurality of optical fiber output ports to receive the light beams from the switching device;

movable mirrors to selectively connect the input ports to the output ports, said movable mirrors having a second passive alignment mechanism as well as a third passive alignment mechanism;

a passive alignment mechanism holder device to passively align the input ports to the movable mirrors using the first and second passive alignment mechanisms; and an output port passive alignment mechanism holder device, wherein the optical fiber output ports further include a fourth mechanism passive alignment mechanism, so that the optical fiber output ports can be passively aligned to the movable mirrors using the third and fourth passive alignment mechanisms and the output port passive alignment mechanism holder device.

2. The device of claim 1, wherein the first and second passive alignment mechanisms are holes, and the passive alignment mechanism holder device further comprises a first set of pins and a second set of pins that are inserted into the first and second passive alignment mechanisms to passively align the movable mirrors and the input ports.

3. The device of claim 1, wherein the third and fourth passive alignment mechanisms are holes, and the output port passive alignment mechanism holder device further comprises a third set of pins and a fourth set of pins that are inserted into the first and second passive alignment mechanisms to passively align the movable mirrors and the output ports.

4. The device of claim 1, wherein the first and second passive alignment mechanisms are pins, and the passive alignment mechanism holder device further comprises one or more holes that receive the first and second passive alignment mechanisms to passively align the movable mirrors and the input ports.

* * * * *